(12) United States Patent
Shingai et al.

(10) Patent No.: US 11,252,307 B2
(45) Date of Patent: Feb. 15, 2022

(54) IMAGING DEVICE AND IMAGING SYSTEM

(71) Applicant: CANON KABUSHIKI KAISHA, Tokyo (JP)

(72) Inventors: Satoru Shingai, Machida (JP); Kenichi Nishimura, Tokyo (JP); Takeru Ohya, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/553,037

(22) Filed: Aug. 27, 2019

(65) Prior Publication Data

US 2020/0076993 A1   Mar. 5, 2020

(30) Foreign Application Priority Data

Sep. 5, 2018  (JP) .............................. JP2018-165936
Jul. 24, 2019  (JP) .............................. JP2019-136399

(51) Int. Cl.
  *H04N 5/225*   (2006.01)
  *G03B 17/55*   (2006.01)
  *H05K 7/20*    (2006.01)

(52) U.S. Cl.
  CPC ........... *H04N 5/2252* (2013.01); *G03B 17/55* (2013.01); *H05K 7/20409* (2013.01)

(58) Field of Classification Search
  CPC .. G03B 17/55; H04N 5/2252; H04N 5/22521; H05K 7/20409
  See application file for complete search history.

(56) References Cited

U.S. PATENT DOCUMENTS

| | | | | |
|---|---|---|---|---|
| 4,656,559 A | * | 4/1987 | Fathi | ................... H05K 7/20409 361/721 |
| 7,854,630 B1 | * | 12/2010 | Wang | ................... H04N 5/2251 439/607.27 |
| 8,061,559 B1 | * | 11/2011 | Chang | ..................... G07F 11/24 221/203 |
| 2008/0271280 A1 | * | 11/2008 | Tiede | .................... A47L 9/0009 15/323 |
| 2009/0180251 A1 | * | 7/2009 | Biagini | ............. H05K 7/20409 361/690 |
| 2010/0067894 A1 | * | 3/2010 | Arbuckle | ......... G08B 13/19619 396/419 |
| 2010/0328466 A1 | * | 12/2010 | Erel | ..................... H04N 5/2256 348/164 |
| 2012/0008220 A1 | * | 1/2012 | Lee | ...................... H02K 41/035 359/822 |
| 2014/0204218 A1 | * | 7/2014 | Gebhard | ................. B60R 11/04 348/164 |

(Continued)

FOREIGN PATENT DOCUMENTS

CN   102315748 A   1/2012
CN   202837769 U   3/2013

(Continued)

*Primary Examiner* — Amy R Hsu

(74) *Attorney, Agent, or Firm* — Canon U.S.A., Inc. I.P. Division

(57) ABSTRACT

A first lateral surface, a second lateral surface, an upper surface, and a bottom surface of a housing of an imaging device is formed of metal and at least two surfaces among the first lateral surface, the second lateral surface, the upper surface, and the bottom surface include a groove region formed of a plurality of grooves.

27 Claims, 5 Drawing Sheets

(56) References Cited

U.S. PATENT DOCUMENTS

| | | | | |
|---|---|---|---|---|
| 2015/0048978 | A1* | 2/2015 | Derovanessian | H05K 7/20 |
| | | | | 343/702 |
| 2015/0355533 | A1* | 12/2015 | Masuda | H01S 5/02469 |
| | | | | 353/52 |
| 2017/0013392 | A1* | 1/2017 | Bora | G08C 17/02 |
| 2017/0078647 | A1* | 3/2017 | Van Hoff | H04N 13/243 |

FOREIGN PATENT DOCUMENTS

| | | |
|---|---|---|
| CN | 108241245 A | 7/2018 |
| JP | 2011-124784 A | 6/2011 |
| JP | 2012-244016 A | 12/2012 |
| JP | 2014011484 A | 1/2014 |

\* cited by examiner

IMAGING DEVICE AND IMAGING SYSTEM

BACKGROUND OF THE INVENTION

Field of the Invention

The present disclosure is related to an imaging device having a feature in a housing, and to an imaging system including the imaging device.

Description of the Related Art

Due to an increasing need for security and safety, the number of monitoring cameras connected via a network is increasing. Furthermore, from the viewpoint of productivity improvement and quality and safety management in factories, industrial cameras are installed in factories and monitoring is carried out.

While the performances of monitoring or industrial imaging devices have improved significantly, power consumption of the imaging devices have increased and the amount of heat generated in the imaging devices have increased; accordingly, heat dissipation has become a technical issue.

In order to improve the heat dissipation of a monitoring camera, Japanese Patent Laid-Open No. 2011-124784 describes a configuration in which radiation fins formed of a plurality of grooves are provided in an outer wall surface at a bottom surface of a housing. However, in the imaging device in Japanese Patent Laid-Open No. 2011-124784, the radiation fins are only provided in the bottom surface of the housing.

SUMMARY OF THE INVENTION

Accordingly, the present disclosure provides an imaging device and an image processing device with improved heat dissipation.

The imaging device according to the present disclosure includes a housing and an imaging element provided in the housing. In the imaging device, a first lateral surface, a second lateral surface, an upper surface, and a bottom surface of the housing are formed of metal, at least the first lateral surface and the upper surface each include a groove region configured of a plurality of grooves, and a first flat surface and a first curved portion are included in a first corner portion configured of the first lateral surface and the upper surface.

Further features of the present disclosure will become apparent from the following description of exemplary embodiments (with reference to the attached drawings).

DESCRIPTION OF THE EMBODIMENTS

First Example Embodiment

FIGS. 1A to 3B are diagrams illustrating an imaging device 1000 including an imaging element 100 and a housing 300. A description will be given hereinafter.

Figure 1A:
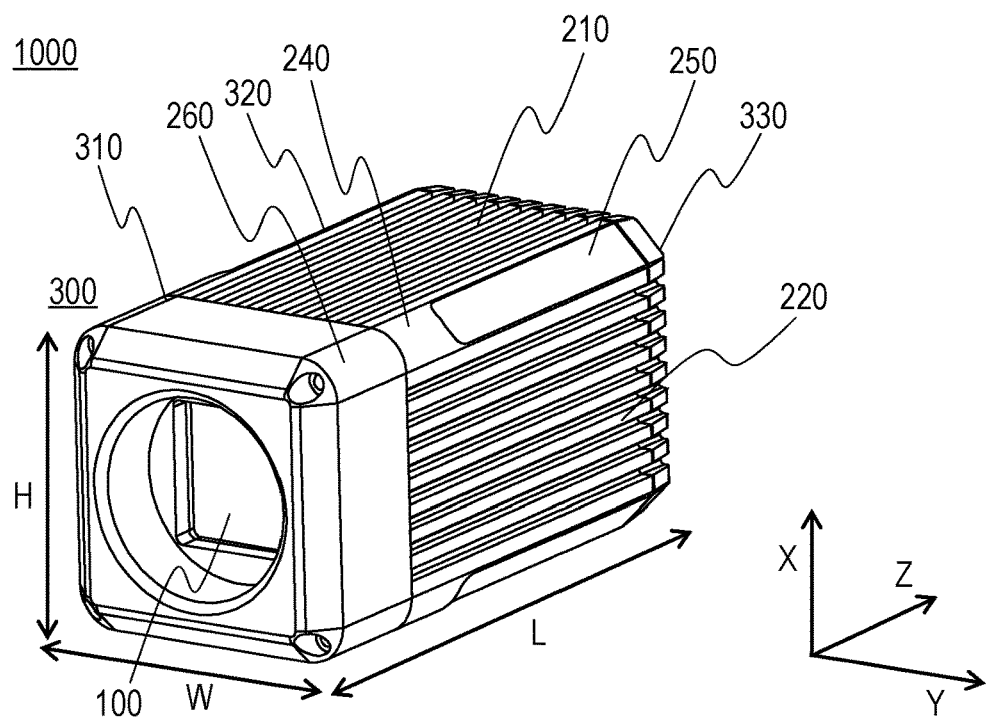
FIGS. 1A and 1B are perspective views of an imaging device according to an embodiment of the present disclosure.
Figure 1B:
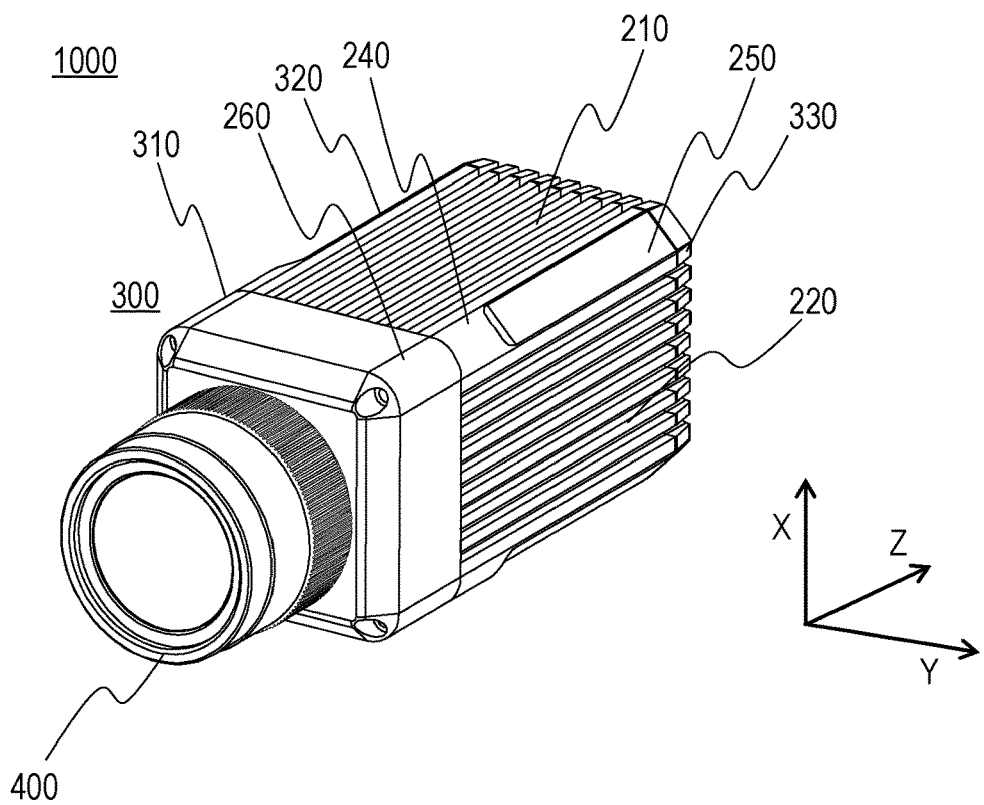

FIG. 1A is a perspective view of the imaging device 1000, and FIG. 1B is a perspective view of the imaging device 1000 provided with an interchangeable lens 400.

Figure 2A:
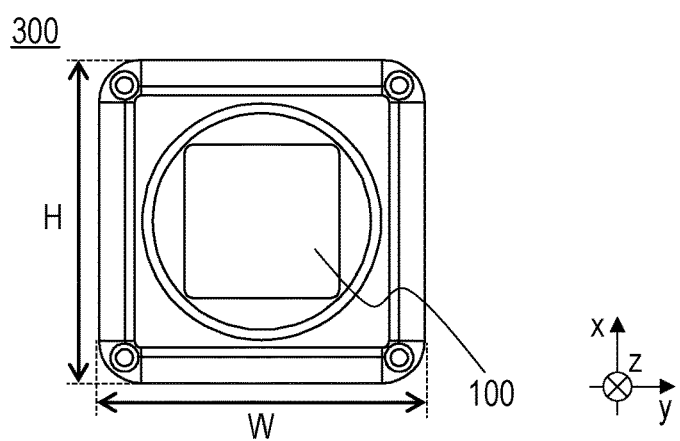
FIGS. 2A to 2C are a front view, a rear view, and a right side view of the imaging device according to an embodiment of the present disclosure.
Figure 2B:
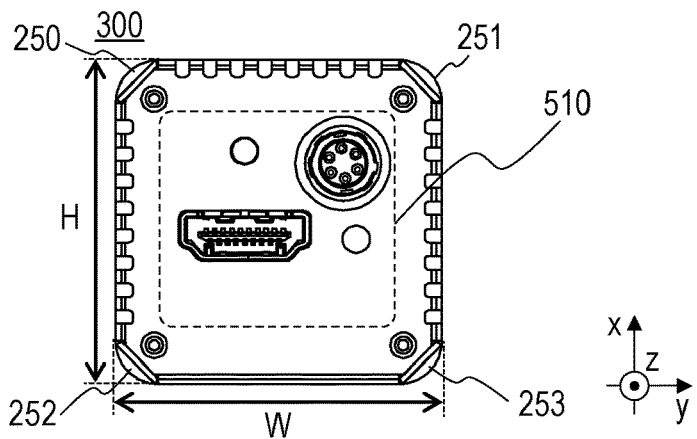
Figure 2C:
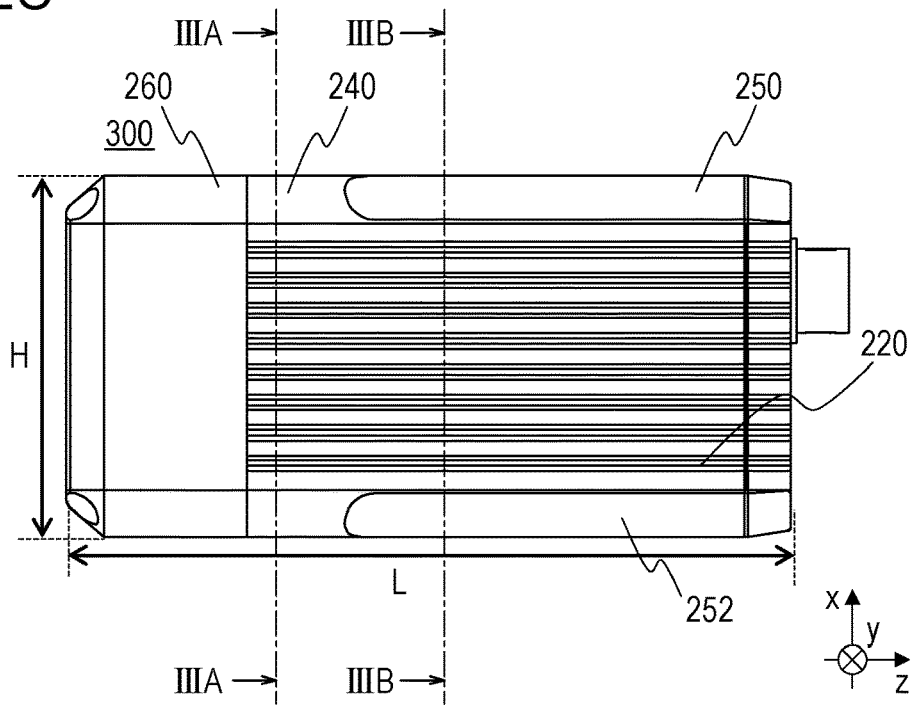

FIGS. 2A to 2C are a front view, a rear view, and a right side view, respectively, of the imaging device 1000.

Figure 3A:
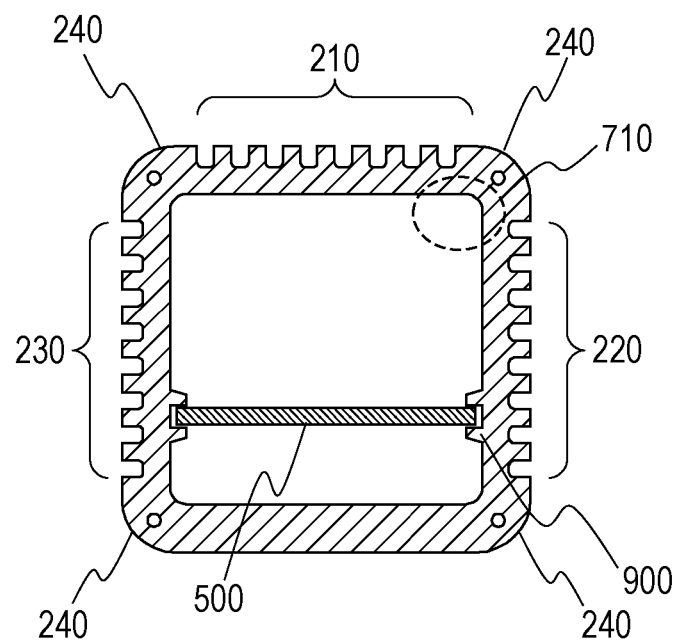
FIGS. 3A and 3B are cross-sectional views of the imaging device according to an embodiment of the present disclosure.
Figure 3B:
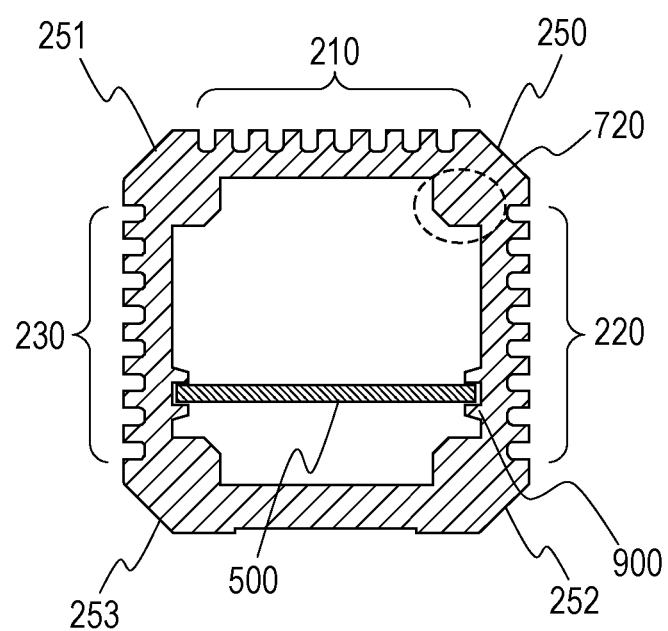

FIG. 3A is a cross-sectional view taken along line IIIA-IIIA in FIG. 2C, and FIG. 3B is a cross-sectional view taken along line in FIG. 2C.

Imaging Element

As illustrated in FIGS. 1A and 2A, the imaging element 100 is provided in the imaging device 1000. The imaging element 100 is an element that converts incident light into an electric signal and is, for example, a CCD sensor or a CMOS sensor, Housing As illustrated in FIGS. 1A and 1B, the housing 300 is formed as a substantially rectangular parallelepiped. A Z direction (a first direction), an X direction (a second direction) orthogonal to the Z direction, and a Y direction (a third direction) orthogonal to the X direction and the Z direction will be defined herein. A length of the housing 300 in the Z direction is longer than lengths thereof in the X direction and the Y direction. Accordingly, the Z direction in the housing 300 may also be referred to as a major-axis direction, and the X direction or the Y direction in the housing 300 may also be referred to as a minor-axis direction.

The housing 300 includes a first housing portion 310, a second housing portion 320, and a third housing portion 330 that are joined to each other length in the Z direction is the longest in the second housing portion 320, is the second longest in the first housing portion 310, and is the shortest in the third housing portion 330. Considering that the second housing portion 320 is the main portion, it can be said that the first housing portion 310 and the third housing portion 330 function as lids.

The imaging element 100 is housed in the first housing portion 310. Furthermore, a signal processing circuit that processes the signal output from the imaging element 100 is housed in the second housing portion 320. The signal processing circuit is a circuit such as, for example, a serializer that serializes signals of a parallel bus output from the imaging element 100. Furthermore, an illumination (not shown) that illuminates an imaging region of the imaging element 100 may be provided at a portion external to the housing 300. A control circuit that controls the illumination provided at the above external portion can be provided in the second housing portion 320.

The first housing portion 310, the second housing portion 320, and the third housing portion 330 are formed of metal. The metal includes a metal selected from, for example, aluminum, iron, and copper. It is desirable that aluminum is selected from the viewpoint of lightness, cost, strength, processability, and heat dissipation.

As illustrated in FIG. 2B, an interface portion 510 (depicted as a broken lined portion) that includes a terminal that outputs information from the imaging device 1000 to an external device, and a terminal that outputs signals that controls the external device is provided in a rear surface of the imaging device 1000. While two terminals are illustrated in FIG. 2B as an example, the example embodiment is not limited to the illustrated configuration. In other words, a single terminal may be provided in the interface portion 510.

Groove Regions

As illustrated in FIGS. 1A to 3B, groove regions 210, 220, and 230 each formed of a plurality of grooves are provided in an upper surface, a right lateral surface (a first lateral surface), and a left lateral surface (a second lateral surface), respectively, of the second housing portion 320 (see FIGS. 3A and 3B for the groove region 230). By providing the groove regions, the heat transfer area can be increased and, accordingly, the heat dissipation of the imaging device 1000 can be improved. Furthermore, in order to improve the heat dissipation, the groove regions are provided in the third housing portion 330 in a similar manner. In particular, since the second housing portion 320 is the longest in the Z direction, it is efficient that the groove regions are provided in the second housing portion 320. Note that while in the above description, the right lateral surface is the first lateral surface and the left lateral surface is the second lateral surface, the right lateral surface can be the second lateral surface and the left lateral surface can be the first lateral surface.

The plurality of grooves are provided so as to extend in the major-axis direction (the Z direction) of the housing 300. When the second housing portion 320 is manufactured by extrusion molding, there is a benefit in using a mold including the groove regions in that the plurality of grooves extending in the major-axis direction can be formed easily in the second housing portion 320.

In FIG. 1A, in the housing 300, the groove regions are provided in the major-axis direction (the Z direction) in the entire areas of the second housing portion 320 and the third housing portion 330. However, in order to improve the heat dissipation, the groove regions can be extended further in the Z direction. In other words, the groove regions can be provided in the first housing portion 310 as well. For example, when a length of the housing 300 in the Z direction is L, the groove regions may be provided across the entire length L.

Furthermore, from the viewpoint of improving the heat dissipation to the extent possible, it is desirable that the groove regions are extended not only in the Z direction but also in the X direction and the Y direction as well.

For example, in FIG. 1A, when a height of the housing 300 in the X direction is H, the groove region having a length of 0.6H or longer is provided in a region of the right lateral surface. Furthermore, the groove region can be provided in a region having a length that is longer than the above. For example, the groove region can be provided in a range having a length of 0.7H or longer. Furthermore, while not shown, the groove region is provided in the left lateral surface and in the X direction in a similar manner in a range having a length of 0.6H or longer.

Furthermore, in FIG. 1A, when a width of the housing 300 in the Y direction is W, the groove region having a length of 0.6W or longer is provided in a region of the upper surface. It goes without saying that the groove region can be provided in a region having a length that is longer than the above. For example, the groove region can be provided at a length of 0.7W or longer.

Note that in FIGS. 1A to 3B, the groove regions have been provided in the housing 300 in three surfaces, namely, the upper surface, the right lateral surface, and the left lateral surface; however, an improvement in the heat dissipation can be made by merely providing the groove regions in at least two surfaces of the housing 300.

Furthermore, in FIGS. 1A to 3B, considering that the imaging device 1000 is installed on a member, an example in which the groove region is not provided in the bottom surface of the housing 300 has been given. However, from the viewpoint of improving the heat dissipation, the groove region may be provided in the bottom surface of the housing 300 as well.

Cutaway Portion

As described above, from the viewpoint of improving the heat dissipation to the extent possible, it is desirable that the groove regions are extended not only in the Z direction but also in the Y direction and the Y direction. According to such a concept, the groove regions are formed in a first corner portion configured of the upper surface and the right lateral surface and in a second corner portion configured of the upper surface and the left lateral surface.

However, when considering the imaging device 1000 as merchandise, marks such as a trademark, a product number, a certification mark for ISO and the like needs to be added to the housing 300. Accordingly, in the present example embodiment, a first flat surface 250 (a first cutaway portion) is provided in the first corner portion of the second housing portion 320 and the third housing portion 330. By adding the trademark and the like on the first flat surface 250, the visibility of the marks can be increased while providing dissipation of heat. If a flat surface is formed on the upper surface and the marks are added thereto, the marks can be visually recognized only from above. If a flat surface is formed on each lateral surface and the marks are added thereto, the marks can be visually recognized only from the corresponding side. On the other hand, in the present example embodiment, since the flat surface (the cutaway portion) s formed in the corner portion and the marks are added thereto, the marks can be visually recognized from at least two directions. In particular, when the imaging device 1000 is used as an industrial camera and when the imaging device 1000 is incorporated in another device, it is assumed that there are not so much opening portions to visually recognize the imaging device 1000. As described above, even in a case in which there are not so much opening portions, since the flat surface is formed in the corner portion, the marks can be visually recognized from various directions.

Figure 5:
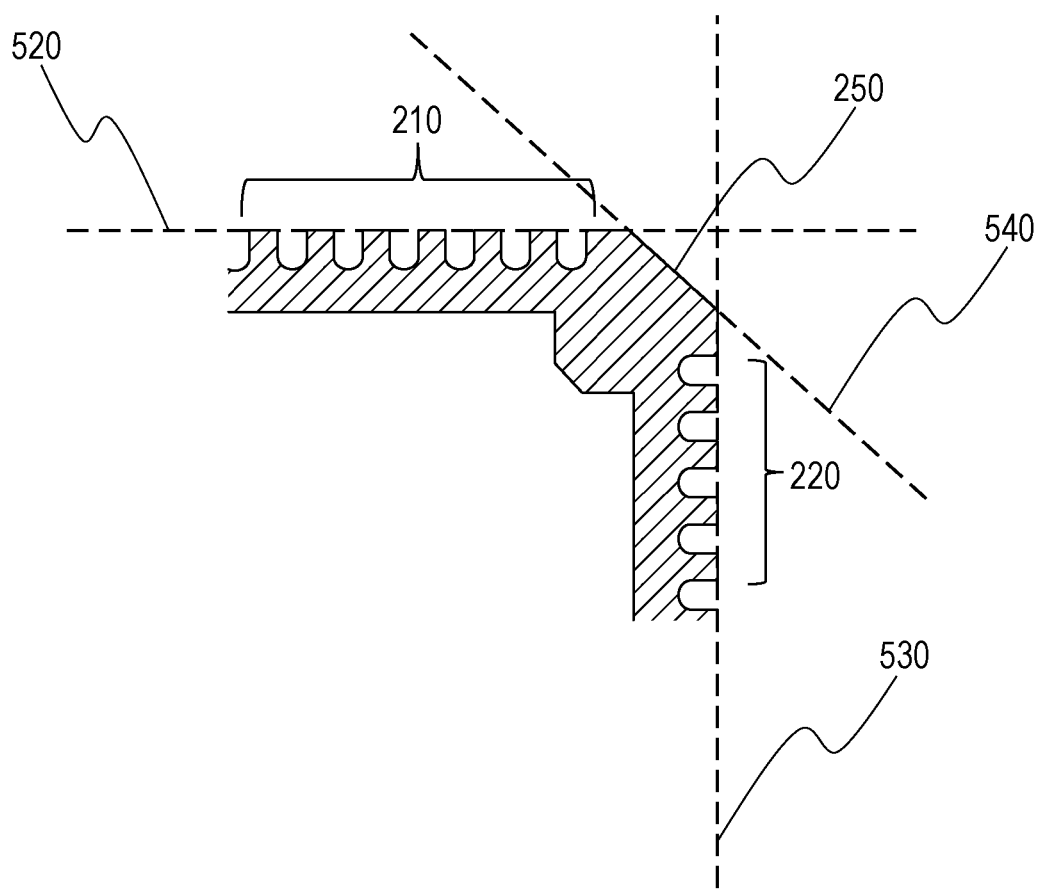
FIG. 5 is an enlarged view of a portion of the cross-sectional view of the imaging device according to an embodiment of the present disclosure.

FIG. 5 is an enlarged view of FIG. 3B. A virtual line 540 including the first flat surface 250 intersects a virtual line 530 including the right lateral surface (the first lateral surface) and a virtual line 520 including the upper surface. As described above, the first flat surface 250 is provided to increase the visibility of the marks and it is only sufficient that the first flat surface 250 is flat to the extent achieving the above increase in visibility.

Furthermore, as illustrated in FIG. 3B, a second flat surface 251 (a second cutaway portion 251) can be provided in the second corner portion configured of the upper surface and the left lateral surface. With the above, the marks needed for the imaging device 1000 can be disposed with high visibility by, for example, adding the trademark of the house mark to the first flat surface 250 and adding the trademark of the merchandise to the second flat surface 251. Alternately, the trademark of the house mark can be added to both the first flat surface 250 and the second flat surface 251.

Furthermore, as illustrated in FIG. 3B, a third flat surface 252 (a third cutaway portion 252) can be provided in a third corner portion configured of the right lateral surface and the bottom surface, and a fourth flat surface 253 (a fourth cutaway portion 253) can be provided in the fourth corner portion configured of the left lateral surface and the bottom surface. The third flat surface 252 and the fourth flat surface 253 are locations where visibility is not high compared with the first flat surface 250 and the second flat surface 251. Accordingly, the product number and the certification mark can be displayed on the third flat surface 252 or the fourth flat surface 253 so that the product number and the certification mark can be referred to as needed. Furthermore, when the trademark of the house mark is added to both the first flat surface 250 and the second flat surface 251, the trademark of the merchandise can be added to the third flat surface 252 or the fourth flat surface 253.

Furthermore, even in a case in which the marks are not provided on the flat surface, by providing the flat surface in the corner portion, there will be benefits such as the flat surface serving as a grip when a person transports the imaging device 1000 and the flat surface serving as a fixing portion when the imaging device 1000 is fixed.

Curved Portion

As illustrated in FIGS. 1A and 1B, the first flat surface 250 is not provided across the entire second housing portion 320. Specifically, the first flat surface 250 is provided in about 80% of the second housing portion 320 in the Z direction. On the other hand, a first curved portion 240 that includes a protruded portion protruding to the outer side with respect to the first flat surface 250 is provided in the first corner portion in the remaining 20% or so of the second housing portion 320.

If the first flat surface 250 is provided in the entire region in the Z direction, while the visibility of the marks increases in the above described manner, the occupancy ratio of the flat surface increases. Accordingly, in a manufacturing site such as a clean room, dust may accumulate on the flat surface and the quality of the product may be affected. Accordingly, by providing a curved portion in each of the corner portions, an accumulation of dust and the like on the flat surfaces can be suppressed.

Furthermore, by providing the first portions, an advantage in that the impact when the imaging device 1000 is dropped to the floor is reduced is obtained.

Inside of Housing

Incidentally, FIG. 3A illustrates a cross section of the first curved portions 240 taken along line IIIA-IIIA in FIG. 2C, and FIG. 3B illustrates a cross section of the first flat surface 250 and the third flat surface 252 taken along line IIIB-IIIB in FIG. 2C.

Referring to FIG. 3B, since the first to fourth flat surfaces 250 to 253 are provided, a thickness of the metal portion constituting the housing is insufficient. Accordingly, as indicated by reference numeral 720, the housing includes metal portions that protrude inwardly. With the above, the strength of the housing can be obtained even when the flat surfaces are provided.

On the other hand, since the first to fourth flat surfaces 250 to 253 are not provided in FIG. 3A, the metal portions that protrude towards the inside of the housing do not have to be provided. As a result, compared with that of FIG. 3B, a sufficient space can be obtained inside the housing in FIG. 3A.

Note that as illustrated in FIG. 1A, the imaging element 100 is installed from the front side of the housing 300 and is disposed in a frontal portion of the housing. When the imaging element 100 of a large size is disposed to obtain an image with a high image quality, it is desirable that the space in the frontal portion of the housing 300 is larger than a space in a rear portion of the housing 300. Accordingly, in the present example embodiment, the first to fourth flat surfaces 250 to 253 are provided in the rear portion of the second housing portion 320, and the first curved portions 240 are provided in the frontal portion of the second housing portion 320.

Furthermore, second curved portions 260 are provided in the corner portions of the first housing portion 310. By providing the second curved portions 260, an accumulation of dust and the like can be suppressed. Furthermore, a space can be obtained inside the frontal portion of the housing. In a case in which fitting members such as screws are inserted from the front of the housing and the first and second housing portions 310 and 320 are fixed to each other, the fitting members can be provided to penetrate the second curved portions 260 and the first curved portions 240. Furthermore, it is desirable that a curvature of each first curved portion 240 and a curvature of each second curved portion 260 are substantially the same. It is desirable that the curvatures are substantially the same since if a difference in the curvatures is large, either the first curved portions 240 or the second curved portions 260 will protrude with respect to the other and form protruded portions, and the protruded portions may cause an unexpected injury or may cause damage in the other members.

Furthermore, as illustrated in FIGS. 3A and 3B, a chip substrate 500 is housed in the second housing portion 320, and the chip substrate 500 is supported by support members 900. The chip substrate 500 is, for example, a substrate on which a signal processing circuit that processes a signal from the imaging element 100 is mounted or a substrate on which a circuit that controls an external device (an LED lighting, for example) is mounted. Furthermore, the support members 900 extend in the major-axis direction of the second housing portion 320 and each include a first support member provided below the chip substrate 500, and a second support member provided above the chip substrate 500. In other words, the direction in which the support members 900 extend is the same as the direction in which the plurality of grooves formed in the surfaces of the housing extend.

Since the support members 900 are formed of metal that has a same composition as the metal constituting the second housing portion 320, an effect in that the heat from the chip substrate 500 can be released efficiently is obtained.

Furthermore, as described above, the groove regions 210, 220, and 230 provided so as to extend in the major-axis direction of the housing 300 can be manufactured by extrusion molding. Accordingly, the support members 900 provided to extend in the major-axis direction can be formed in the same process as the process in which the groove regions 210, 220, and 230 are formed. With the above, the manufacturing process can be simplified.

Furthermore, in the configuration illustrated in FIGS. 3A and 3B, the chip substrate 500 only needs to be installed in the grooves, each formed with the first support member and the second support member, and fixing with screws and the like is not needed. With the above, the number of man-hours for positioning the chip substrate 500 and the housing and the number of man-hours for fixing the chip substrate 500 and the housing to each other can be reduced and productivity can be improved.

Note that in the above description, a case in which a set of support members support a single chip substrate has been described; however, a plurality of chip substrates can be disposed by providing a plurality of sets of support members.

Interchangeable Lens

FIG. 1B illustrates an imaging device 1000 on which the interchangeable lens 400 has been mounted. An appropriate lens according to the object may be used as the interchangeable lens 400. If a height of the interchangeable lens 400 is equivalent to or lower than the height of the housing 300, the possibility of the interchangeable lens 400 becoming damaged and the like can be reduced when the imaging device 1000 is installed.

Second Example Embodiment

In the present example embodiment, a description of an imaging system including the imaging device described in the example embodiment described above will be given.

Block Diagram

Figure 4A:
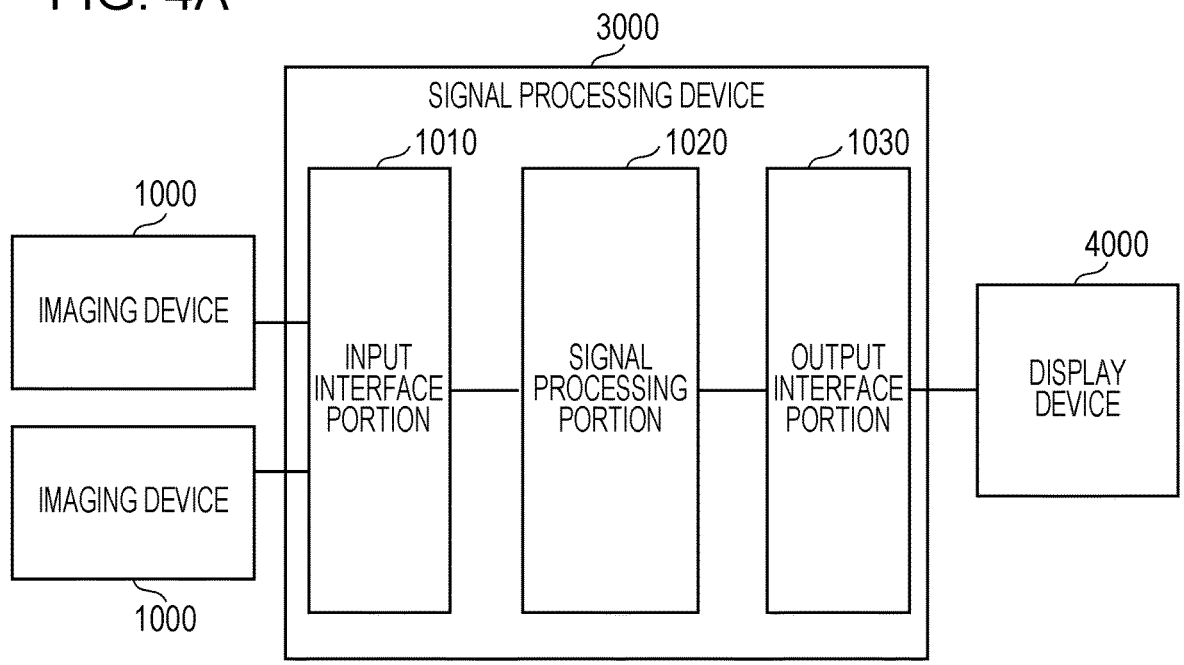
FIGS. 4A and 4B are a block diagram and a perspective view of an imaging system according to an embodiment of the present disclosure.

FIG. 4A is a block diagram illustrating the imaging system.

A signal processing device 3000 includes an input interface portion 1010, a signal processing portion 1020, and an output interface portion 1030. Furthermore, the imaging system includes the imaging devices 1000 and the signal processing device 3000. The imaging system may selectively include a display device 4000.

A signal output from the imaging device 1000 is input to the input interface portion 1010 through a wire (a signal line). FIG. 4A illustrates an example in which signals output from two imaging devices 1000 are input. The signals input to the input interface portion 1010 is processed in the signal processing portion 1020. Furthermore, the result of the processing in the signal processing portion 1020 is output to and displayed on the display device 4000.

The input interface portion 1010 may use interfaces that confirms to various standards or may use original interfaces. The former includes, for example, USB, (registered trademark), and GbE. Furthermore, the output from each imaging device 1000 does not necessarily have to be input to the signal processing portion 1020 through the wire, and the signal from each imaging device 1000 may be input to the signal processing portion 1020 wirelessly. For example, Wi-Fi and LTE may be used.

Furthermore, the output interface portion 1030 can also use various wired or wireless interfaces.

The signal processing portion 1020 processes image signals from the imaging devices 1000. Examples of image processing used in machine vision includes pattern matching, blob analysis, edge measuring, and spatial filtering.

Using web applications and application programming interfaces (API), the signal processing portion 1020 can be configured to be accessible from an external portion. Accordingly, by introducing the imaging system according to the present example embodiment to a factory, management of each process can be performed easily even from remote locations.

The display device 4000 displays images acquired by the imaging device 1000 and results of signal processing performed in the signal processing portion 1020. For example, when the imaging system is applied to an industrial camera system, the imaging system will be capable of showing a result of an appearance inspection process performed in a factory.

In FIG. 4A, the imaging system is configured so that signals from two imaging devices 1000 are input to the signal processing device 3000. By using a plurality of imaging devices 1000, imaging from a plurality of directions can be performed and, accordingly, imaging of a wider area can be performed. Furthermore, the distance to the object can be measured with the signals from the imaging devices 1000 and by obtaining a phase difference by comparing the images of the object. Furthermore, while an example of inputting signals from two imaging devices 1000 to the signal processing device 3000 has been described, the imaging system may be configured so that a signal from one imaging device 1000 is input to the signal processing device 3000. Alternatively, the imaging system may be configured so that signals from three or more imaging devices 1000 are input to the signal processing device 3000.

Housing of Signal Processing Device

Figure 4B:
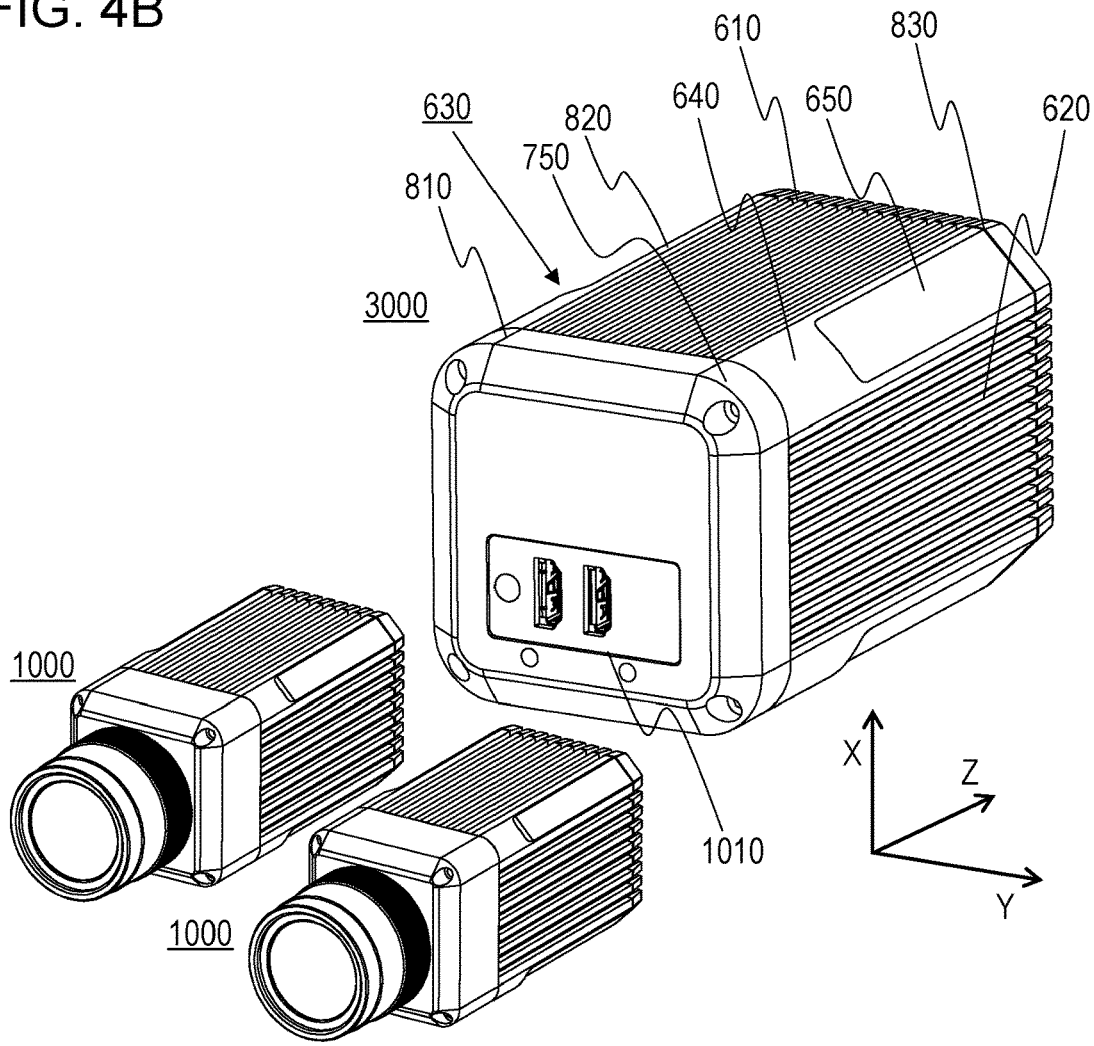

FIG. 4B is a perspective view of the imaging devices 1000 and the signal processing device 3000 illustrated in FIG. 4A. The wires that connect the imaging devices 1000 and the signal processing device 3000 to each other are not shown. A single imaging device 1000 and the signal processing device 3000 are connected to each other through a single piece of wire.

Note that the housing of the signal processing device 3000 has a shape that is similar to that of the housing of each imaging device 1000. In other words, the housing of the signal processing device 3000 includes a first housing portion 810, a second housing portion 820, and a third housing portion 830. Groove regions 610, 620, and 630 in which a plurality of grooves extend in the Z direction are provided in the upper surfaces, the right lateral surfaces (the first lateral surfaces), and the left lateral surfaces (the second lateral surfaces, not shown) of the second housing portion 820 and the third housing portion 830. The heat dissipation can be improved with the above.

Furthermore, a first flat surface 650 is provided in the first corner portion configured of the right lateral surface and the upper surface. Since the first flat surface 650 is configured of a flat surface, marks such as the trademark and the product number can be added thereto. Note that while not shown, a flat surface may be formed in each of the second corner portion configured of the upper surface and the left lateral surface, the third corner portion configured of the right lateral surface and the bottom surface, and the fourth corner portion configured of the left lateral surface and the bottom surface, and the marks may be added to each of the flat surfaces.

Furthermore, the entire first corner portion is not configured of the first flat surface 650, and a first curved portion 640 is provided in a portion of the first corner portion. With the above, an accumulation of dust can also be prevented when the housing of the signal processing device 3000 is installed in a factory. Furthermore, while not illustrated, the curved portion can be provided in each of the second corner portion, the third corner portion, and the fourth corner portion as well.

Additionally, a plurality of chip substrates that include the input interface portion 1010, the signal processing portion 1020, and the output interface portion 1030 are housed inside the housing of the signal processing device 3000. Accordingly, support members that support the plurality of chip substrates can be provided inside the housing of the signal processing device 3000 as well. The support members are formed of metal that has a same composition as the metal constituting the housing of the signal processing device 3000 and are members that are provided to extend in the Z direction. The support members can be manufactured by extrusion molding. Accordingly, the support members inside the housing can be manufactured in the same process as the process in which the groove regions on the outside of the housing are formed. Furthermore, the chip substrates only need to be installed in the grooves, each formed with the first support member and the second support member, and fixing with screws and the like is not needed. With the above, the number of man-hours for positioning the chip substrates and the housing and the number of man-hours for fixing the chip substrates and the housing to each other can be reduced and productivity can be improved.

In addition, since the design of the housing of the signal processing device 3000 and the design of the housing of each imaging device 1000 are designed in a similar manner, there is a benefit in that it can be easily distinguished that a single system is constructed with the above combination.

Others

The above description has been given so that the right lateral surface is the first lateral surface and the left lateral surface is the second lateral surface; however, the left lateral surface can be the first lateral surface and the right lateral surface can be the second lateral surface. In such a case, the corner portion configured of the left lateral surface and the upper surface becomes the first corner portion. Furthermore, the corner portion configured of the right lateral surface and the upper surface becomes the second corner portion.

The present disclosure can provide an imaging device and an image processing device in which the heat dissipation have been improved compared with the configuration described in Japanese Patent Laid-Open No. 2011-124784.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-165936, filed Sep. 5, 2018, and Japanese Patent Application No. 2019-136399, filed Jul. 24, 2019, which are hereby incorporated by reference herein in their entirety.

What is claimed is:

1. An imaging device comprising:
a housing including a first housing portion, a second housing portion, and a third housing portion; and
an imaging element provided in the housing,
wherein a first lateral surface, a second lateral surface, an upper surface, and a bottom surface of the housing are formed of metal,
wherein at least the first lateral surface and the upper surface each include a groove region configured of a plurality of grooves,
wherein a first flat surface and a first curved portion are included in a first corner portion configured of the first lateral surface and the upper surface,
wherein the first flat surface is provided at the second housing portion and at the third housing portion, and
wherein the first curved portion is provided at the first housing portion and at the second housing portion.

2. The imaging device according to claim 1,
wherein the housing is substantially a rectangular parallelepiped having a major axis in a first direction, and
wherein the plurality of grooves extend in the first direction.

3. The imaging device according to claim 2,
wherein each groove region is disposed in a second direction orthogonal to the first direction, and
wherein when a length of the housing in the second direction is H, a groove region having a length of 0.6H or longer is provided in a region of the first lateral surface or the second lateral surface.

4. The imaging device according to claim 3,
wherein the groove region having the length of 0.6W or longer is disposed in a third direction orthogonal to the first direction and the second direction, and
wherein, when a length of the housing in the third direction is W, the groove region having the length of 0.6W or longer is provided in a region of the upper surface.

5. The imaging device according to claim 1, wherein a virtual line including the first flat surface intersects a virtual line including the first lateral surface and a virtual line including the upper surface.

6. The imaging device according to claim 5,
wherein the imaging element is included in a frontal portion of the housing, and
wherein the first curved portion is provided closer to the frontal portion than the first flat surface.

7. The imaging device according to claim 1, wherein a second corner portion configured of the second lateral surface and the upper surface includes a second flat surface.

8. The imaging device according to claim 7, wherein the second corner portion includes a second curved portion.

9. The imaging device according to claim 1,
wherein a third corner portion configured of the first lateral surface and the bottom surface includes a third flat surface, and
wherein a fourth corner portion configured of the second lateral surface and the bottom surface includes a fourth flat surface.

10. The imaging device according to claim 1, further comprising a support member provided inside the housing,
wherein the support member is configured to support a chip and is formed of metal that is the same as the metal that forms the first lateral surface, the second lateral surface, the upper surface, and the bottom surface of the housing.

11. The imaging device according to claim 10, wherein the support member extends in a direction that is the same as a direction in which the plurality of grooves extend.

12. The imaging device according to claim 1, wherein the metal is aluminum.

13. The imaging device according to claim 1, wherein the housing is formed by extrusion molding.

14. An imaging system comprising:
an imaging device having a housing and an imaging element provided in the housing,
wherein the housing includes a first housing portion, a second housing portion, and a third housing portion,
wherein a first lateral surface, a second lateral surface, an upper surface, and a bottom surface of the housing are formed of metal,
wherein at least the first lateral surface and the upper surface each include a groove region configured of a plurality of grooves,
wherein a first flat surface and a first curved portion are included in a first corner portion configured of the first lateral surface and the upper surface,
wherein the first flat surface is provided at the second housing portion and at the third housing portion, and
wherein the first curved portion is provided at the first housing portion and at the second housing portion; and
a signal processing device that processes a signal from the imaging device.

15. The imaging system according to claim 14,
wherein a housing of the signal processing device incudes a first lateral surface, a second lateral surface, an upper surface, and a bottom surface, and is substantially a rectangular parallelepiped having a major axis in a first direction, wherein the first lateral surface, the second lateral surface, the upper surface, and the bottom surface of the signal processing device are formed of metal, wherein the first lateral surface, the second lateral surface, and the upper surface each include a groove region formed of a plurality of grooves, and wherein the plurality of grooves extend in the first direction.

16. The imaging system according to claim 15, wherein the housing of the signal processing device includes a flat surface in a first corner portion configured of the first lateral surface and the upper surface of the signal processing device.

17. The imaging system according to claim 16, wherein the housing of the signal processing device includes a first curved portion in the first corner portion of the signal processing device.

18. An apparatus comprising:
a container including a first portion, a second portion, and a third portion; and
a device provided in the container,
wherein the container includes a first lateral surface, a second lateral surface, an upper surface, and a bottom surface,
wherein a first flat surface and a first curved portion are included in a first corner portion configured of the first lateral surface and the upper surface,
wherein the first flat surface is provided at the second portion and at the third portion or the first curved portion is provided at the first portion and at the second portion,
wherein the container is substantially a rectangular parallelepiped having a major axis in a first direction, and
wherein a plurality of grooves extend in the first direction.

19. The apparatus according to claim 18,
wherein the first flat surface is provided at the second portion and at the third portion, and
wherein the first curved portion is provided at the first portion and at the second portion.

20. The apparatus according to claim 18, wherein at least the first lateral surface and the upper surface each include groove region configured of the plurality of grooves.

21. The apparatus according to claim 18, wherein the first lateral surface, the second lateral surface, the upper surface, and the bottom surface are formed of metal.

22. The apparatus according to claim 18, wherein the device provided in the container is an imaging element.

23. An apparatus comprising:
a container including a first portion, a second portion, and a third portion; and
a photoelectric conversion element provided in the container,
wherein the container includes a first lateral surface, a second lateral surface, an upper surface, and a bottom surface,
wherein a first flat surface and a first curved portion are included in a first corner portion configured of the first lateral surface and the upper surface, and
wherein the first flat surface is provided at the second portion and at the third portion or the first curved portion is provided at the first portion and at the second portion.

24. The apparatus according to claim 23,
wherein the first flat surface is provided at the second portion and at the third portion, and
wherein the first curved portion is provided at the first portion and at the second portion.

25. The apparatus according to claim 23, wherein at least the first lateral surface and the upper surface each include a groove region configured of a plurality of grooves.

26. The apparatus according to claim 23, wherein the first lateral surface, the second lateral surface, the upper surface, and the bottom surface are formed of metal.

27. The apparatus according to claim 25,
wherein the container is substantially a rectangular parallelepiped having a major axis in a first direction, and
wherein the plurality of grooves extend in the first direction.

* * * * *